United States Patent
Nishikawa

(10) Patent No.: US 6,781,432 B2
(45) Date of Patent: Aug. 24, 2004

(54) CONTROL CIRCUIT OF MOSFET FOR SYNCHRONOUS RECTIFICATION

(75) Inventor: Yukihiro Nishikawa, Tokyo (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/609,341

(22) Filed: Jun. 27, 2003

(65) Prior Publication Data

US 2004/0037099 A1 Feb. 26, 2004

(30) Foreign Application Priority Data

Jun. 27, 2002 (JP) ........................................ 2002-187818

(51) Int. Cl.$^7$ ................................................ H03L 5/00
(52) U.S. Cl. ...................... 327/330; 327/531; 327/532; 363/89
(58) Field of Search ................................ 327/531, 532, 327/533, 518, 520, 521, 330; 363/89, 125, 126, 127

(56) References Cited

U.S. PATENT DOCUMENTS 5,663,877 A * 9/1997 Dittli et al. .................. 363/127
6,271,712 B1 * 8/2001 Ball .............................. 327/531
6,711,039 B2 * 3/2004 Brkovic ....................... 363/127

FOREIGN PATENT DOCUMENTS

JP          11-146637          5/1999

* cited by examiner

*Primary Examiner*—Tuan T. Lam
*Assistant Examiner*—Hiep Nguyen
(74) *Attorney, Agent, or Firm*—Rossi & Associates

(57) ABSTRACT

A control circuit for a MOSFET used in a synchronous rectification circuit applies a gate voltage to the MOSFET during most of a period in which a current flows in a MOSFET. As a result, conduction loss is decreased, making it possible to increase device efficiency and form a device that is compact and lightweight.

9 Claims, 15 Drawing Sheets

CONTROL CIRCUIT OF MOSFET FOR SYNCHRONOUS RECTIFICATION

BACKGROUND OF INVENTION

The present invention relates to a control circuit of a MOSFET used for rectifying or circulating an output current of a switching power supply or the like.

FIG. 16 depicts a conventional synchronous rectifying circuit in which a diode rectifying circuit is connected to a secondary side of a forward converter. FIG. 17 is a timing chart illustrating an operation of the circuit shown in FIG. 16. In FIG. 16, reference numeral 101 denotes a DC power supply, 102 denotes a MOSFET (n-channel depletion MOSFET), 103 denotes a transformer, 104, 108 and 109 denote diodes, 105 denotes a control circuit of the MOSFET 102, 106 denotes a smoothing reactor, 107 denotes a smoothing capacitor, and $N_1$, $N_2$ and $N_3$ denote a primary winding, a secondary winding and a tertiary winding, respectively, (number of turns thereof are also taken as $N_1$, $N_2$ and $N_3$, respectively) of the transformer 103. A load, not shown, is conned across the smoothing capacitor 107.

In FIG. 16 and FIG. 17, the MOSFET 102 is subjected to on-off control by the control circuit 105 so that an output voltage becomes constant. When the MOSFET 102 is turned ON in a period (1) in FIG. 17, a DC power supply voltage $V_{in}$ is applied to the primary winding $N_1$ of the transformer 103. In the secondary winding $N_2$ of the transformer 103, a voltage of $(N_2/N_1)$ times a primary winding voltage $V_{P1}$ is generated, which, while storing energy in the smoothing reactor 106 through the diode 108, releases the energy to a load side. An exciting current $I_{m1}$ flows in exciting inductance (not shown) of the transformer 103.

When the MOSFET 102 is turned OFF in a period (2) in FIG. 17, the exciting energy, being stored in the exciting inductance of the transformer 103, is released from the tertiary winding $N_3$ of the transformer 103 to the DC power supply 101 through the diode 104. In the secondary winding $N_2$ of the transformer 103, a voltage of $-(N_2/N_1)$ times a primary winding voltage is generated, and the reverse voltage is applied to the diode 108, which transfers a current $I_{D1}$, having flowed in the diode 108, into the diode 109. At this time, the energy stored in the smoothing reactor 106 is released to the load side through the diode 109.

In a period (3) in FIG. 17, when the exciting current $I_{m1}$ becomes zero, a reverse voltage $V_{in}$ is applied to the diode 104 to cut it off, which causes the primary winding voltage $V_{P1}$ of the transformer 103 to become zero. In the period (3), the energy stored in the smoothing reactor 106 is continuously released to the load side through the diode 109.

Subsequent to this, in the period (1), the MOSFET 102 is turned ON again and a voltage of $(N_2/N_1)$ times a primary winding voltage $V_{P1}$ is generated in the secondary winding $N_2$ of the transformer 103, applying a reverse voltage to the diode 109, which transfers a current $I_{D2}$, having flowed in the diode 109, into the diode 108.

Thereafter, the period (1) to the period (3) are repeated, by which a waveform of a current $I_L$ flowing in the smoothing reactor 106 becomes a synthesized waveform of $I_{D1}$ and $I_{D2}$.

FIG. 18 is a second conventional synchronous rectifying circuit in which MOSFETs (n-channel depletion MOSFETs) are used in the forward converter in FIG. 16 instead of the diodes 108 and 109. FIG. 19 is a timing chart illustrating an operation of the circuit shown in FIG. 18.

In FIG. 18, reference numerals 110 and 111 denote MOSFETs, 113 and 114 denote resistors each being connected between a gate of each MOSFET and each end of a secondary winding $N_2$ of the transformer 103. In FIG. 18, components having the same functions as those in FIG. 16 are denoted by the same reference numerals and signs with explanation thereof being omitted.

When an output voltage of a synchronous rectifying circuit using diodes as that in FIG. 16 is a voltage as low as being on the order from 3.3V to 5V, a forward voltage drop of the diode (on the order of 0.5 to 1V) causes a proportion of a conduction loss to become very large.

In a MOSFET with a negative drain current, the drain current flows in a body diode of the MOSFET when no voltage is applied between the gate and the source. This causes a voltage drop on the order of 0.5V. The voltage drop, however, can be reduced by applying a positive voltage between the gate and the source which makes resistivity equivalent to that of the on-resistance to be exhibited. The prior art in FIG. 18 is presented by noting this point.

The differences between the circuits of FIGS. 18 and 16 are shown in FIG. 19. In the period (1), a voltage $V_{Q3}$, applied between a drain and a source of the MOSFET 111, is applied to the MOSFET 110 as a gate signal for generating a negative drain current $I_{Q2}$ to reduce the conduction loss of the MOSFET 110. In the period (2), a voltage $V_{Q2}$, applied between a drain and a source of the MOSFET 110, is applied to the MOSFET 111 as a gate signal for flowing a negative drain current $I_{Q3}$ to reduce the conduction loss of the MOSFET 111. Hatched portions in $I_{Q2}$ and $I_{Q3}$ in FIG. 19 represent periods in which the conduction losses are reduced.

With the prior art as shown in FIG. 18, during the period (3) shown in FIG. 19, a period appears during which no gate voltage is applied to the MOSFET 111 to reduce conduction loss. As a result, device efficiency is decreased and the cooling capacity against heat generation must be increased by enlarging a cooling device. Consequently, the entire device cannot readily be made compact and lightweight.

SUMMARY OF THE INVENTION

Accordingly, it is a subject of the present invention to provide a control circuit of a MOSFET for synchronous rectification in which a gate voltage is applied to the MOSFET in almost all of a period in which a current flows in a MOSFET, thereby reducing conduction loss and increasing device efficiency in a device that can be compact and light in weight.

In a preferred embodiment, a cathode of a first diode is connected to a drain of a MOSFET for synchronous rectification, a first current supplying unit is connected to an anode of the first diode, and a resistor is connected between the anode of the first diode and a source of the MOSFET to measure a voltage across the resistor. The voltage across the resistor varies depending on a voltage drop when a current flows in the MOSFET for synchronous rectification. Therefore the value of the voltage across the resistor is compared to a first reference voltage by a voltage comparing unit and the output is amplified. A gate voltage is applied between a gate and a source of the MOSFET for synchronous rectification by a gate driving unit.

Thus, by setting the current level taken as the reference to be small, it becomes possible to apply a gate voltage in almost all of a period in which a current flows in the MOSFET for synchronous rectification, which makes it possible to reduce a conduction loss more than in the prior art shown in FIG. 18.

In a further embodiment, as the above-described first reference voltage, a forward voltage drop in a second diode to which a current is supplied from a second current supplying unit is used. This makes it possible to compensate temperature to forward voltage characteristics of the first diode to enhance a current detection accuracy.

Moreover, by making the first diode and the second diode have forward temperature characteristics the current of the forward direction to temperature-voltage characteristics approximately identical with each other, the current detection accuracy can be further enhanced.

Still further, when a difference between the voltage across the above-described resistor and the first reference voltage becomes equal to or less than a certain value, a gate voltage for the MOSFET is made so as not to be generated. Namely, when a negative current flowing in the MOSFET for synchronous rectification is reduced and the voltage across the above described resistor exceeds the first reference voltage, the gate of the MOSFET for synchronous rectification is to be made OFF. At this time, a current is to be made flow in a body diode of the MOSFET for synchronous rectification to increase the forward voltage drop, which is judged by the first voltage comparing unit as an increase in the current and the gate of the MOSFET for synchronous rectification is brought to be made ON again. As a result, the ON and OFF are repeated to increase a driving loss of the MOSFET. Therefore, the gate of the MOSFET, once being made OFF, is made so as not to be driven until the MOSFET for synchronous rectification is brought into an OFF state. This can suppress the increase in the driving loss Still further, a saturable reactor may be connected between the drain of the MOSFET and the cathode of the first diode. This reduces a reverse recovery loss when a current-flowing in the body diode of the MOSFET for synchronous rectification is brought into reverse recovery. Along with this, should a zero-crossing of the negative current flowing in the drain of the MOSFET for synchronous rectification occurs before a gate voltage for the MOSFET is brought to a level in which the MOSFET is OFF due to a delay of the control circuit of the MOSFET for synchronous rectification to cause a large current to flow in the positive direction in the drain before the MOSFET is turned off, a rate of increase in the current is limited low after the zero-crossing of the current to make it possible to reduce a turn-off loss.

In addition, the above-described control circuit is made up into an IC chip to be mounted on a chip of the MOSFET, which reduces the number of required components and decreases component mounting area to allow for a compact device.

Still further, a magnetic material having a saturable characteristic is preferably arranged around the chip of the MOSFET for synchronous rectification.

BRIEF DESCRIPTION OF THE DRAWINGS

The invention will be described with reference to certain preferred embodiment thereof, wherein.

DETAILED DESCRIPTION OF PREFERRED EMBODIMENTS

Figure 1:
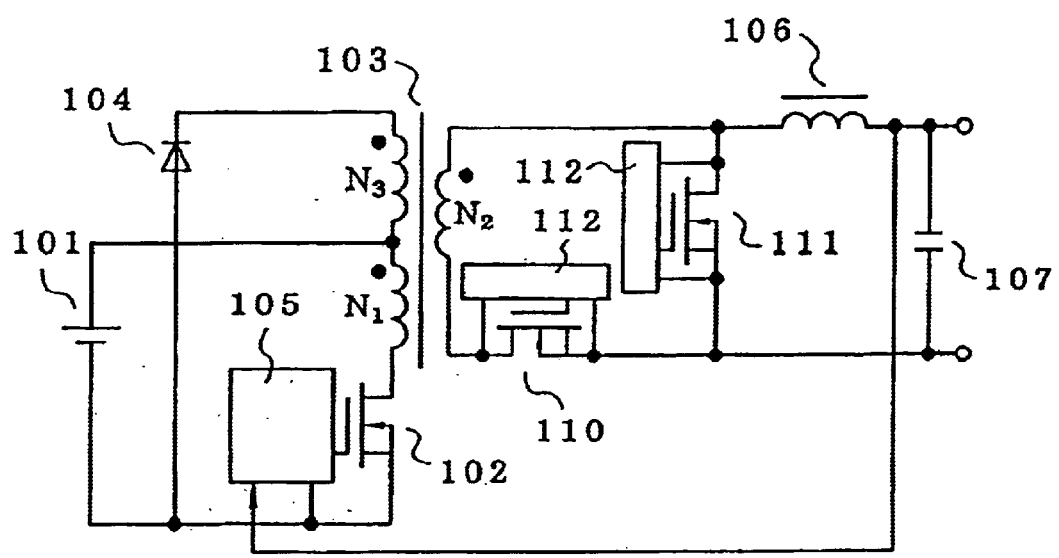
FIG. 1 is a circuit diagram showing a synchronous rectifying circuit to which each of the modes for carrying out the invention is applied.
Figure 18:
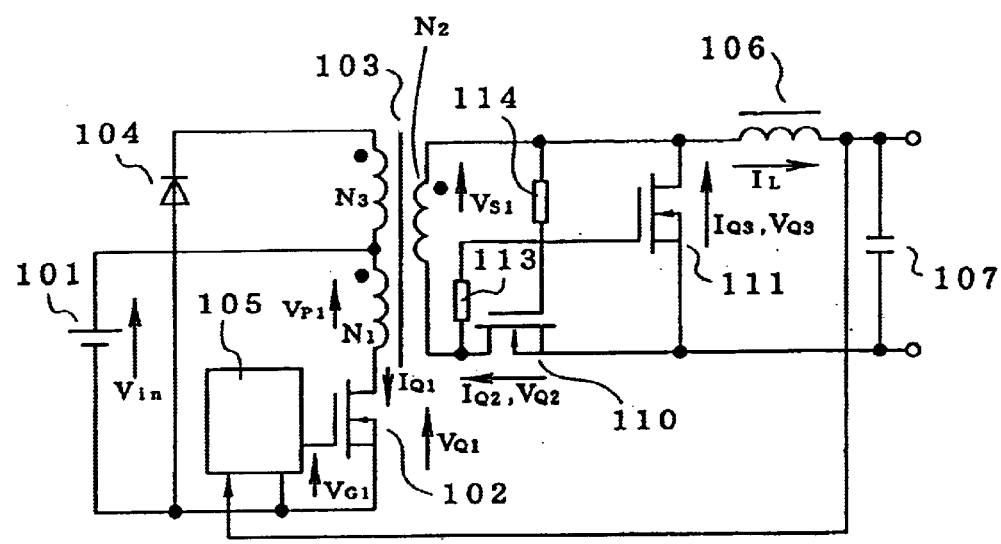
FIG. 18 is a circuit diagram showing a second prior art.
Figure 19:
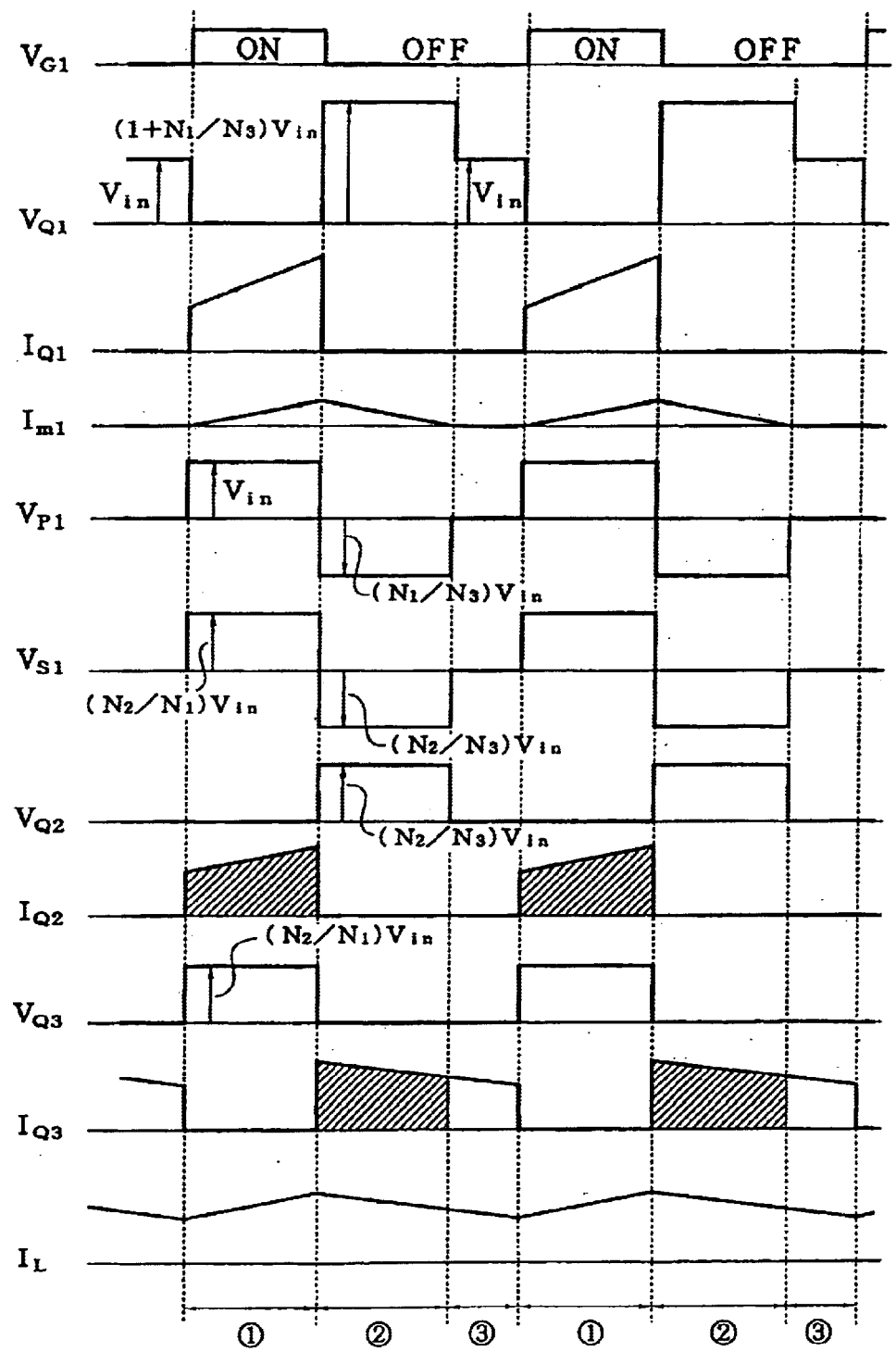
FIG. 19 is a timing chart for illustrating an operation of the circuit in FIG. 18.

In the following description, modes for carrying out the invention will be explained with reference to the drawings. FIG. 1 is a circuit diagram showing a synchronous rectifying circuit to which each of the modes for carrying out the invention is applied. Between the electrodes (gate, source, drain) of each of two MOSFETs for synchronous rectification 110 and 111, a control circuit 112 according to the invention is connected. Incidentally, components having the same functions as those in the prior art in FIG. 18 are denoted with the same reference numerals and signs with explanations thereof being omitted.

Figure 2:
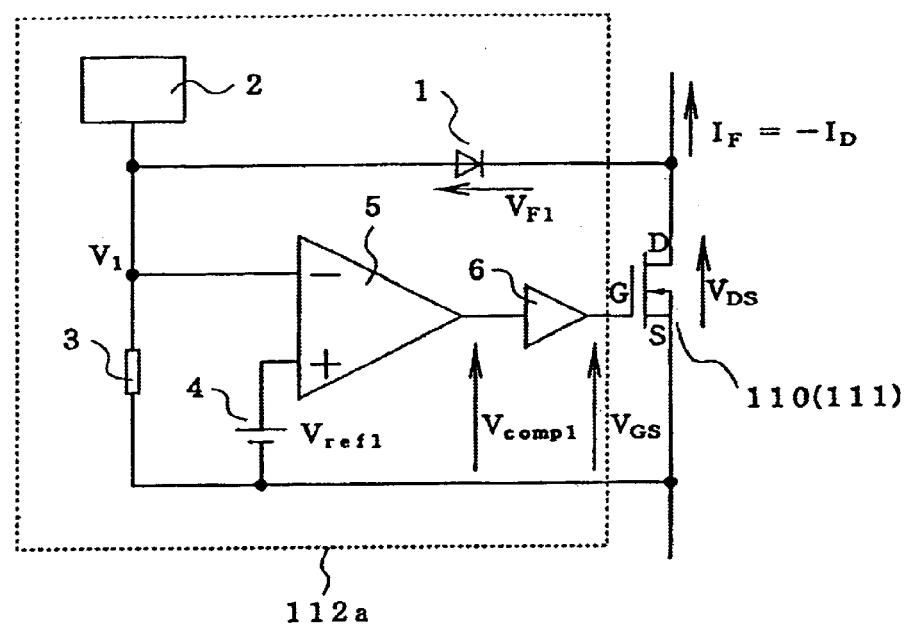
FIG. 2 is a circuit diagram showing a first mode for carrying out the invention.

FIG. 2 is a circuit diagram of a control circuit 112a according to the first mode for carrying out the invention. In FIG. 2, a first diode 1 is a blocking diode preventing a high electric potential from being applied to a signal system inside the control circuit 112a when the MOSFET 110 (111) is in an OFF state. An anode of the diode 1 is connected to a first current supplying unit 2, and a cathode thereof is connected to a drain of the MOSFET 110 (111).

The current supplying unit 2 is a current source for supplying a current to the diode 1 and a resistor 3, a series circuit including a power supply and a resistor, or the like.

The voltage across the resistor 3 varies depending on a voltage drop when a current flows in the MOSFET for synchronous rectification. A first voltage comparing unit 5 compares a voltage $V_1$ across the resistor 3 connected to the current supplying unit 2 and a first reference voltage $V_{ref1}$ by a first reference current source 4 to produce a gate signal of the MOSFET 110 (111). A gate driving unit 6 amplifies the gate signal produced by the voltage comparing unit 5 and applies this signal to a gate of the MOSFET 110 (111) to drive the MOSFET. A timing for driving the gate of the MOSFET for synchronous rectification is obtained with a certain current level taken as a reference. By setting the current level taken as the reference to be small, a gate voltage can be applied during almost all of a period in which a current flows in the MOSFET for synchronous rectification, thus making it possible to reduce conduction loss below that of the prior art shown in FIG. 18.

In FIG. 2, reference sign $V_{comp1}$ denotes an output voltage of the voltage comparing unit 5, $V_{GS}$ denotes a gate-source voltage of the MOSFET 110 (111), $V_{DS}$ denotes a drain-source voltage of the MOSFET 110 (111), $V_{F1}$ denotes a voltage across the diode 1 and $I_F$ denotes a forward current (a negative drain current $I_D$).

Figure 3:
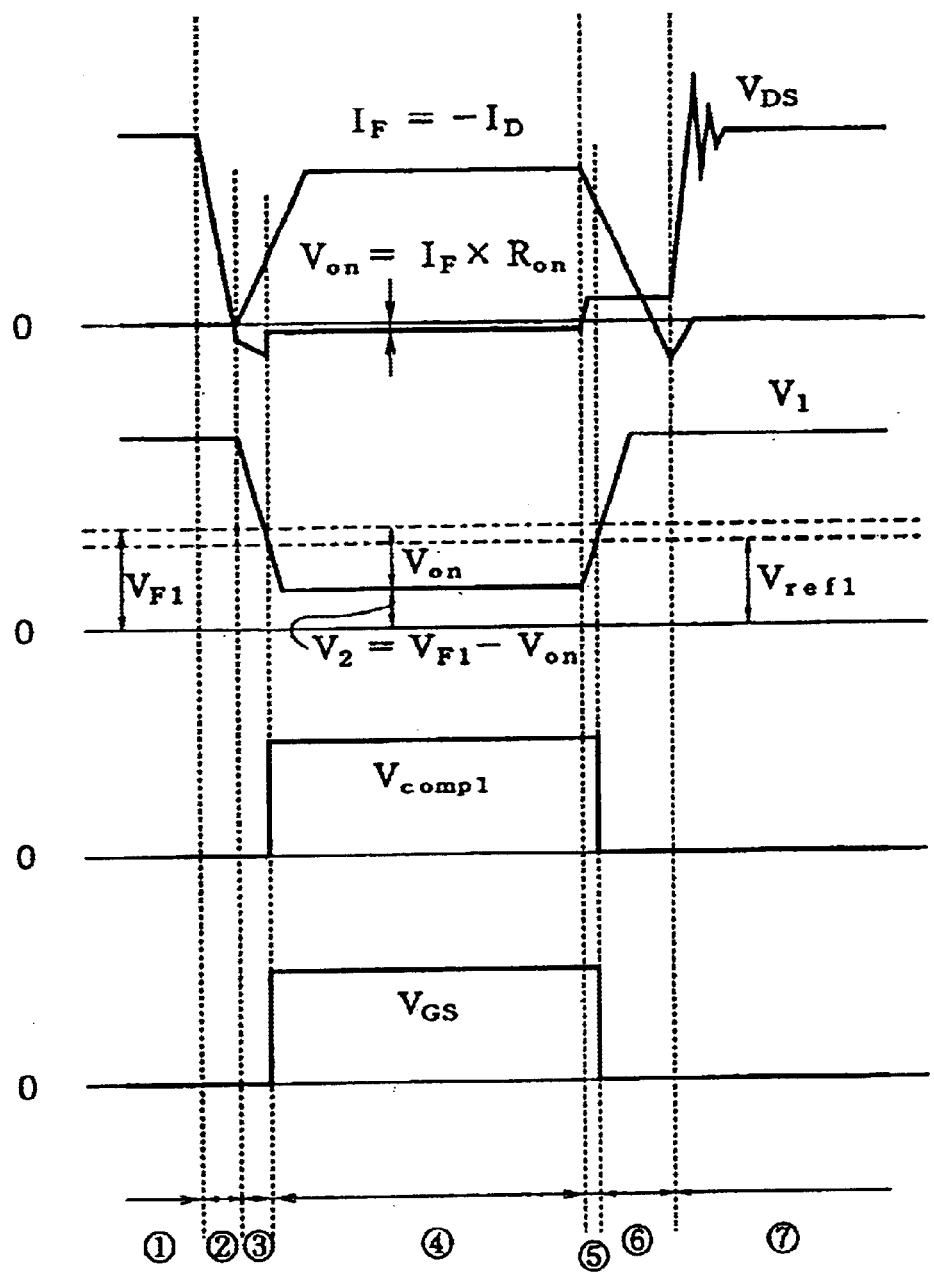
FIG. 3 is a timing chart for illustrating an operation of the circuit in FIG. 2.

An operation of the circuit in FIG. 2 will be explained with reference to a timing chart in FIG. 3. Here, the operation will be explained by dividing the operation into a periods (1) through. (7). The operation is carried out until a current having flowed in the MOSFET 110 in FIG. 1 is transferred to the MOSFET 111 by the turning off of MOSFET 102 via a current flowing in the MOSFET 110. Then the current that flowed in the MOSFET 111 is transferred to the turning ON of MOSFET 110 again. FIG. 3 shows all of waveforms of voltages and currents at sections on the side of the MOSFET During Period 1 the MOSFET 110 is in an ON state. The MOSFET 111 is in an OFF state with the diode 1 OFF with a reverse voltage applied thereto. The voltage $V_1$ across the resistor 3 becomes a voltage of an unshown power supply for the current supplying unit 2. At this time, the output voltage $V_{comp1}$ of the voltage comparing unit 5 of the MOSFET 111 side is in the Low level and the gate-source voltage $V_{GS}$ of the MOSFET 111 is in the Low level.

During Period 2, when the MOSFET 102 is turned OFF, the MOSFET 110 is turned OFF to raise the drain-source voltage $V_{DS}$ and the drain-source voltage $V_{DS}$ of the MOSFET 111 is lowered down to zero.

During Period 3, when the drain-source voltage $V_{DS}$ of the MOSFET 111 becomes zero, a body diode of the MOSFET 111 is brought into conduction to start the forward current $I_F$. The diode 1 is brought into conduction to cause the voltage $V_1$ across the resistor 3 to begin to decrease.

During Period 4, when the voltage $V_1$ across the resistor 3 becomes below the reference voltage $V_{ref1}$, the output $V_{comp1}$ of the voltage comparing unit 5 is brought to the High level and the gate-source voltage $V_{GS}$ of the MOSFET 111 is also brought to the High level. This makes the MOSFET 111 exhibit resistivity to reduce a conduction loss. An on-voltage $V_{on}$ of the MOSFET becomes a voltage value determined by a product of the forward current $I_F$ and an on-resistance $R_{on}$.

During Period 5 when the MOSFET 102 turned ON again the current that was flowing in the MOSFET 111 starts to decrease with a current reduction rate ($-di/dt=V_{S1}/L_s$) determined by a generated voltage $V_{S1}$ and an unshown inductance $L_s$ of wiring of the transformer 103. At this time, a voltage is generated in a parasitic inductance between the drain and the source of the MOSFET 111 to change the drain-source voltage $V_{DS}$ from negative to positive, by which a reverse voltage is applied to the diode 1 to turn it OFF. Therefore, the voltage $V_1$ across the resistor 3 starts to rise.

During Period 6, when the voltage $V_1$ across the resistor 3 becomes above the reference voltage $V_{ref1}$, the output voltage $V_{comp1}$ of the voltage comparing unit 5 is brought to the Low level and the gate-source voltage $V_{GS}$ of the MOSFET 111 is also brought to the Low level. This makes the MOSFET 111 change to exhibit characteristics of a body diode.

During Period 7 the MOSFET 111 enters a blocked state with the body diode brought into reverse recovery, by which the drain-source voltage $V_{DS}$ rises up to the generated voltage $V_{S1}$ of the transformer 103.

Thereafter, the operations in the period (1) to the period (7) are repeated. This allows a gate voltage to be applied to the MOSFET 111 over the periods (4) and (5) which occupy most of periods in which the current $I_F$ flows in the MOSFET 111 to make it possible to reduce a conduction loss.

Figure 4:
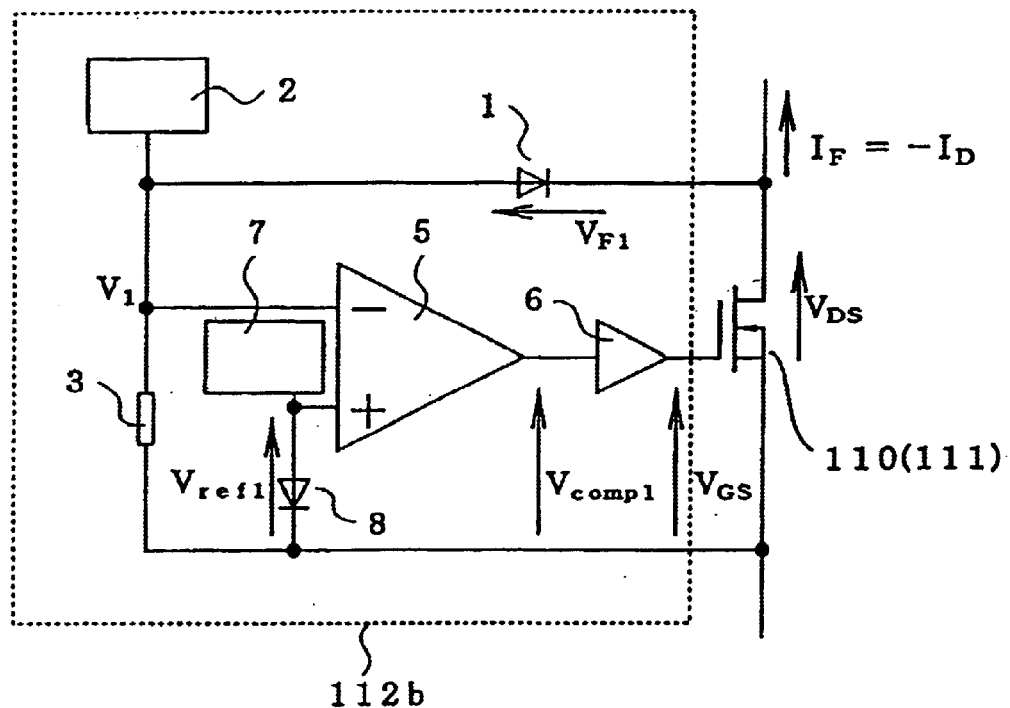
FIG. 4 is a circuit diagram showing a second mode for carrying out the invention.

In FIG. 4, there is shown a second mode for carrying out the invention. Components having the same functions as those in the first mode in FIG. 2 are denoted with the same reference numerals; the explanations thereof being omitted. In a control circuit 112b shown in FIG. 4, a second diode 8 is substituted for the reference current source 4 in FIG. 2. A forward voltage drop in the diode 8 when a current is made to flow from a second current supplying unit 7 is used as a first reference voltage $V_{ref1}$. This configuration makes it possible to compensate for the temperature to forward voltage characteristics of the first diode and enhance current detection accuracy.

Figure 5:
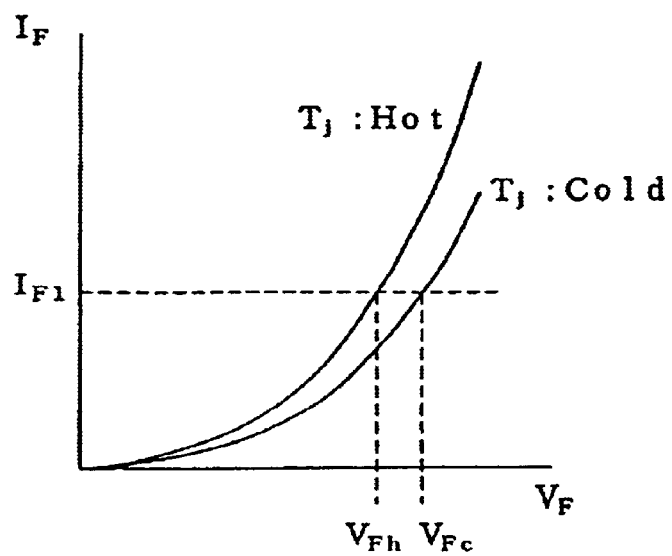
FIG. 5 is a diagram showing forward temperature characteristics of a diode.

Forward current to voltage characteristics of a diode vary depending on a junction temperature $T_j$ as shown in FIG. 5. In general, as the junction temperature $T_j$ becomes higher, a forward voltage to the same forward current ($I_{F1}$) becomes smaller ($V_{Fh}<V_{Fc}$).

Therefore, as shown in FIG. 2, in the case where the reference voltage $V_{ref1}$ of the voltage comparing unit 5 is made constant, changes in temperature change the forward voltage of the diode 1, and the voltage $V_1$ across the resistor 3 which is compared with the reference voltage $V_{ref1}$ also changes with the change in temperature.

Figure 6:
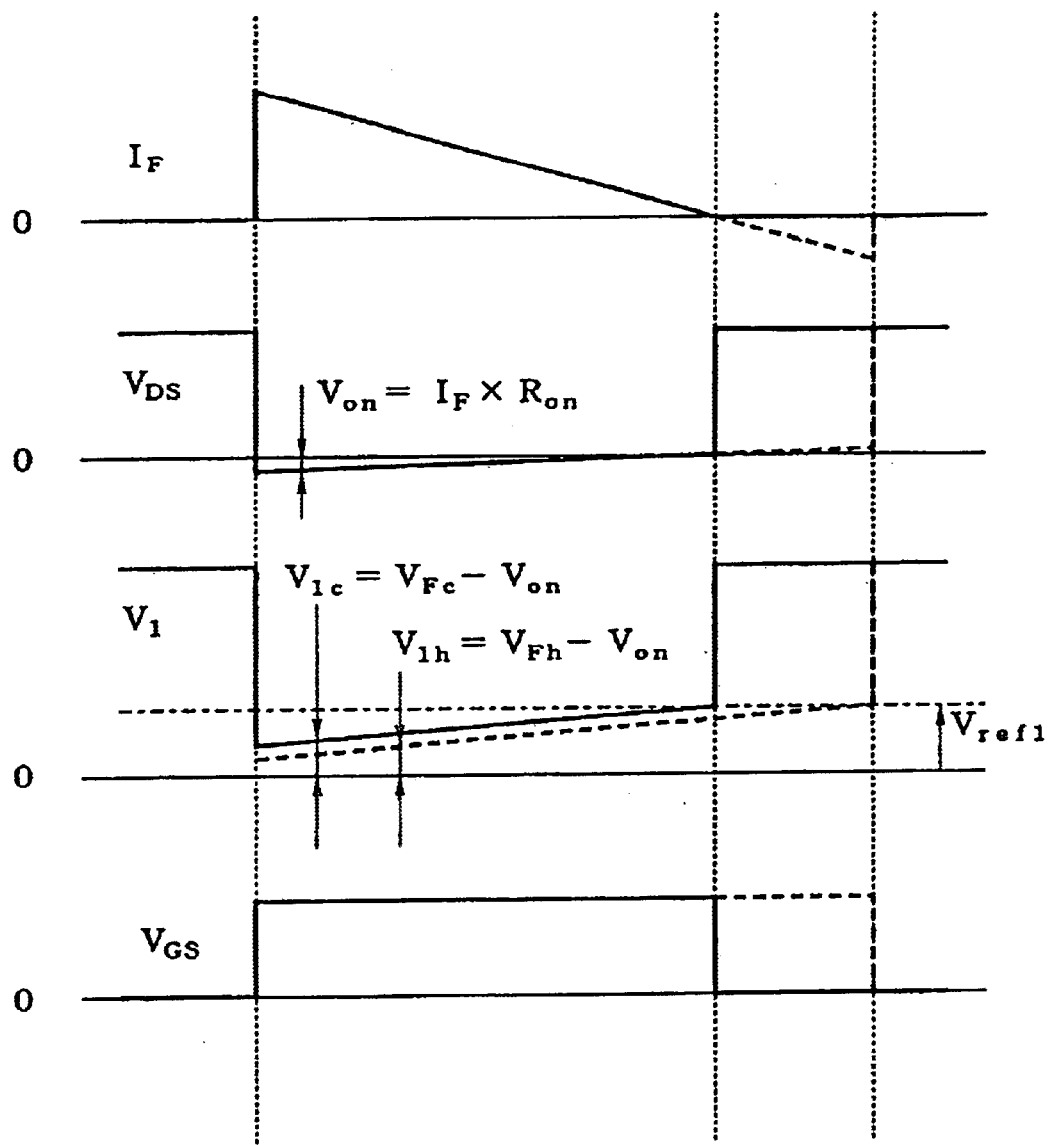
FIG. 6 is a timing chart for illustrating an operation of the circuit in FIG. 4.

FIG. 6 shows a timing chart illustrating an operation when a temperature is changed. The timing chart in FIG. 6 shows states when a current in the smoothing reactor 106 in FIG. 1 is intermittent under such a condition as a light load. In FIG. 6, an ideal operation when a temperature is low is shown in solid lines, while an operation when the temperature is high is shown in broken lines.

In this mode, a gate voltage is to be given in a period in which a negative drain current flows in the MOSFET. This reduces the voltage $V_1$ across the resistor 3, as shown in the broken line, when a temperature becomes high, to lower the forward voltage of the diode 1. Therefore, even though a feedthrough current, which is a drain current making a zero-crossing in a positive direction (a portion shown in a broken line in $I_F$ in FIG. 6), is generated, a gate voltage is continuously given to the MOSFET until $V_1$ rises above the reference voltage $V_{ref1}$. Then, with the gate of the MOSFET turned OFF, the MOSFET is to turn OFF the feedthrough current, which produces a turn-off loss and lowers efficiency. In addition, a large surge voltage is generated which causes problems such as an increase in noise.

For preventing such problems, a circuit arrangement as in FIG. 4 is provided, by which the voltage $V_1$ is lowered with an increase in temperature, and the reference voltage $V_{ref1}$ of the diode 8 is also lowered. Thus, a mutual large or small relation between the voltage $V_1$ and the reference voltage $V_{ref1}$ becomes almost unchanged. As a result, generation of the feedthrough current can be suppressed. By making the first diode and the second diode have forward temperature characteristics approximately identical with each other, the current detection accuracy can be further enhanced and the feedthrough current almost completely suppressed.

Figure 7:
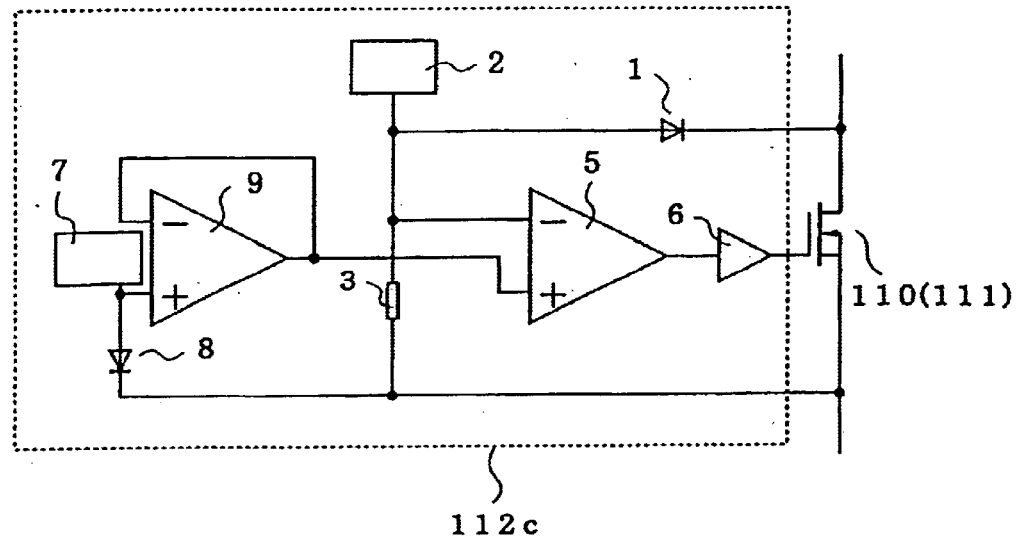
FIG. 7 is a circuit diagram showing a modified example of the second mode for carrying out the invention.

A modified example of the above-described second mode is shown in FIG. 7. In a control circuit 112c according to the modified example, an arrangement is provided so that a forward voltage drop at the diode 8 is applied to an input terminal of the voltage comparing unit 5 through a voltage buffer 9 once. Since the operation thereof is similar to that of the circuit in FIG. 4 an explanation thereof will be omitted.

Figure 8:
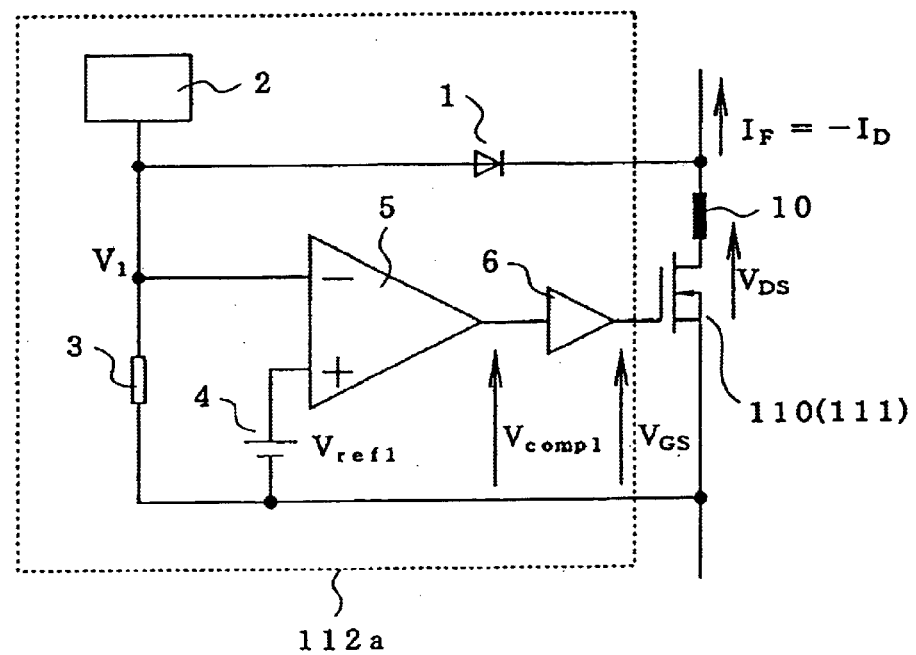
FIG. 8 is a circuit diagram showing a third mode for carrying out the invention.

In FIG. 8, there is shown a third mode for carrying out the invention. Components having the same functions as those in the first mode in FIG. 2 are denoted with the same reference numerals and signs with explanations thereof are omitted. In FIG. 8, the arrangement of the control circuit 112a is the same as that in FIG. 2. In the mode in FIG. 8, however, a saturable reactor 10 is connected between the drain of the MOSFET 110 (111) and the cathode of the diode 1 in the circuit in FIG. 2. The saturable reactor 10 can be similarly connected in the circuits in FIG. 4 and FIG. 7.

Figure 9:
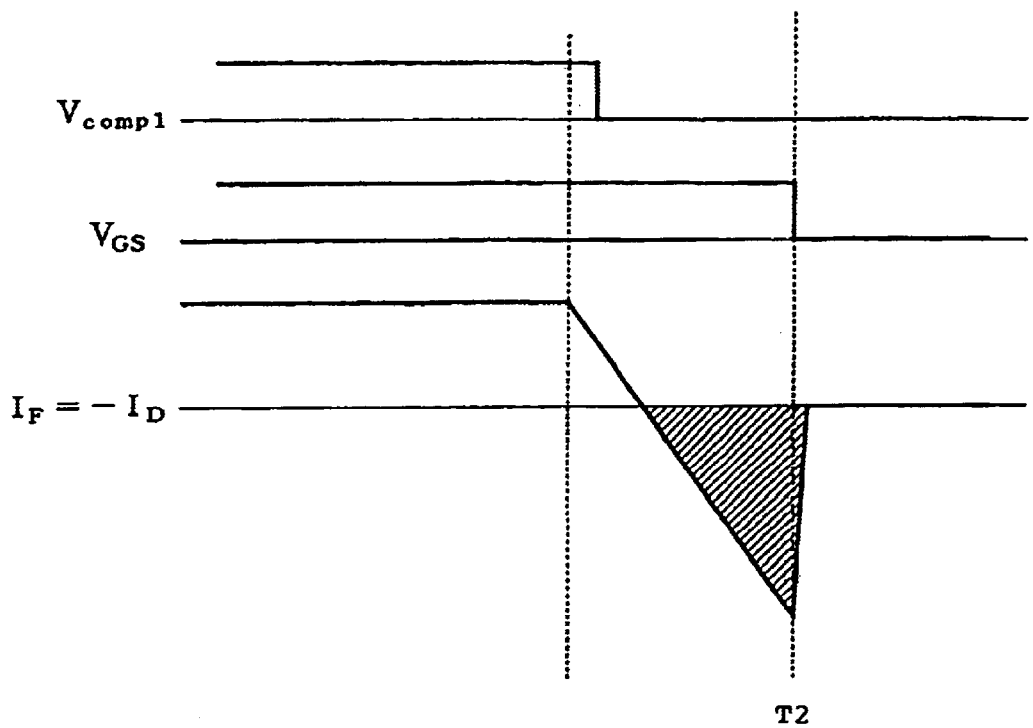
FIG. 9 is a timing chart for illustrating an operation of the circuit in FIG. 8.
Figure 10:
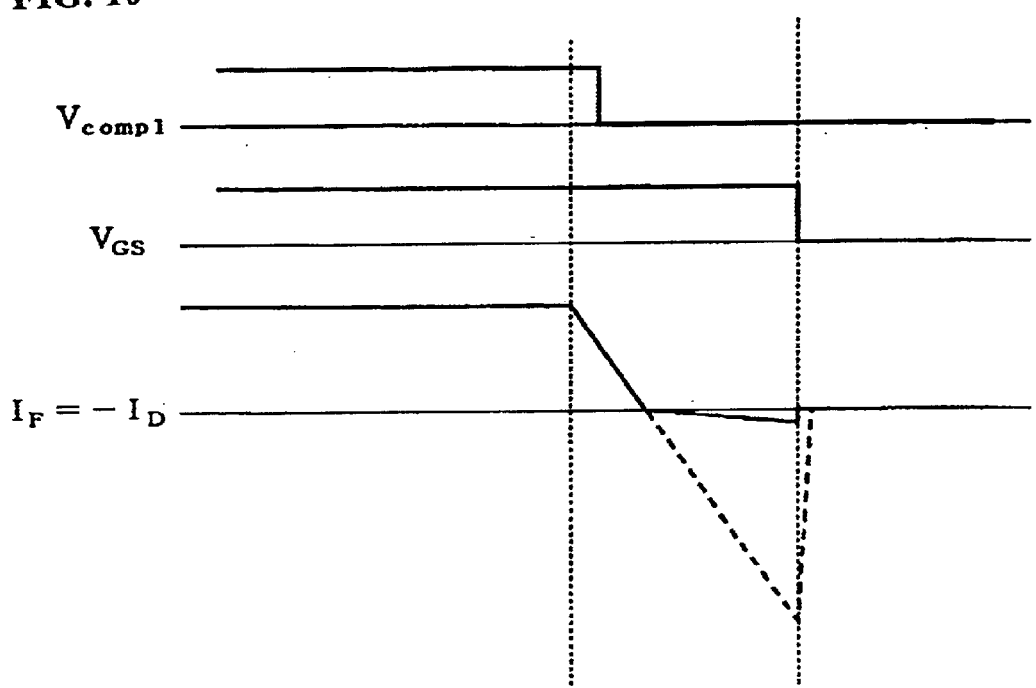
FIG. 10 is a timing chart for illustrating an operation of the circuit in FIG. 8.

FIGS. 9 and 10 are timing charts each illustrating an effect when the saturable reactor 10 is connected.

FIG. 9 shows an operation in which, due to a delay time of the control circuit 112a, the MOSFET is turned OFF with the gate voltage becoming the Low level from a time $T_2$ after a zero-crossing of the current flowing in the MOSFET, and a feedthrough current thus flows in the MOSFET as shown by a hatched line portion.

FIG. 10 shows an operation when the saturable reactor 10 is connected as in the third mode in FIG. 8.
The saturable reactor 10 saturates with a current flowing in the MOSFET 110 (111) in the positive direction ($I_F$>0) to have an inductance value becoming approximately zero. When the current decreases to make a zero-crossing, the saturation is made reset to increase an inductance value. At this time, the current flowing in the MOSFET exhibits a sudden reduction in a change in current due to the increase in the inductance value of the saturable reactor 10. Therefore, by connecting the saturable reactor 10 between the drain of the MOSFET 110 (111) and the cathode of the diode 1, even though the turning OFF of the gate voltage of the MOSFET 110 (111) is a little delayed, the feedthrough current can be suppressed to be small.

Thus the invention reduces a reverse recovery loss when a current flowing in the body diode of the MOSFET for synchronous rectification is brought in to reverse recovery. Along with this, should a zero-crossing of the negative current flowing in the drain of the MOSFET for synchronous rectification occur before the gate of the MOSFET is brought to an OFF level due to a delay of the control circuit of the MOSFET for synchronous rectification, and a large current is made to flow in the positive direction in the drain before the MOSFET is turned off, a rate of increase in the current is limited low after the zero-crossing of the current to make it possible to reduce a turn-off loss.

Figure 11:
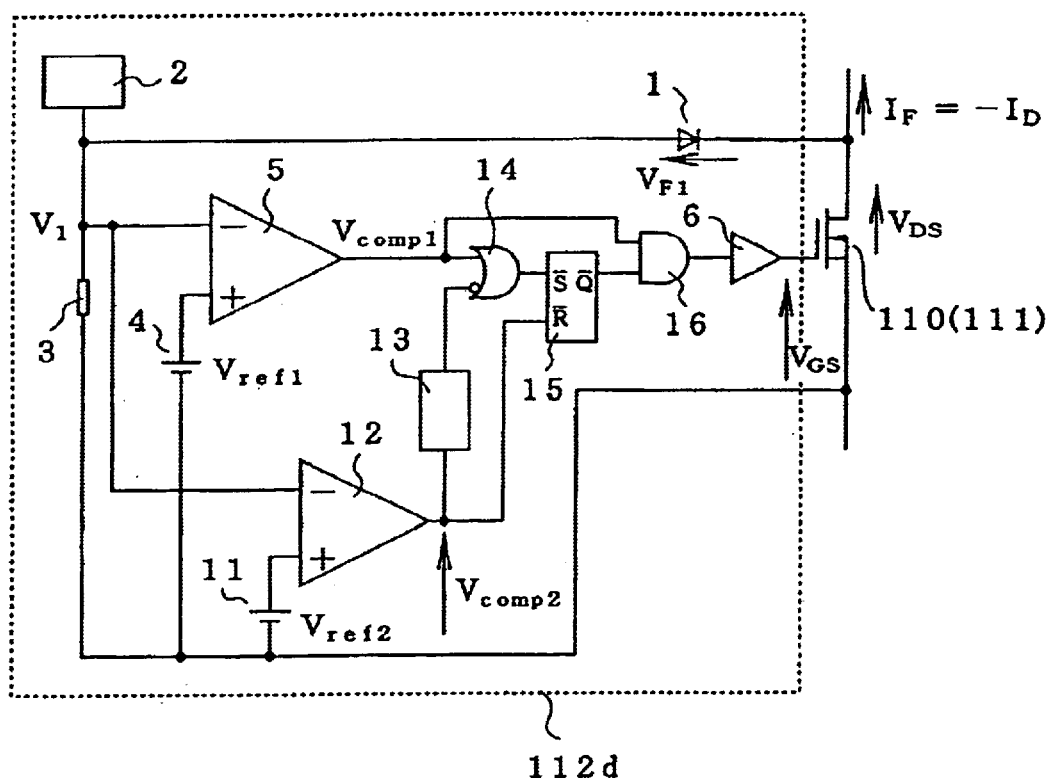
FIG. 11 is a circuit diagram showing a fourth mode for carrying out the invention.

In FIG. 11, there is shown a fourth mode for carrying out the invention. Components having the same functions as those in the first mode in FIG. 2 are denoted with the same reference numerals and signs with explanations thereof are omitted.

In a control circuit 112d shown in FIG. 11, reference numeral 11 denotes a second reference current source (a second reference voltage $V_{ref2}$), 12 denotes a second comparing unit to which the second reference voltage $V_{ref2}$ and the voltage $V_1$ across the resistor 3 are inputted, 13 denotes a delay circuit to which an output of the second voltage comparing unit 12 is applied, 14 denotes an OR circuit to which an output $V_{comp1}$ of the first voltage comparing unit 5 and an output of the delay circuit 13 are applied, 15 denotes an RS flip-flip circuit to which an output of the OR circuit 14 and an output of the second voltage comparing unit 12 are applied as a set signal and a reset signal, respectively, and 16 denotes an AND circuit to which an output of the RS flip-flip circuit and an output of the first voltage comparing unit 5 are applied. The output of the AND circuit 16 is inputted to the gate driving unit 6.

Figure 12:
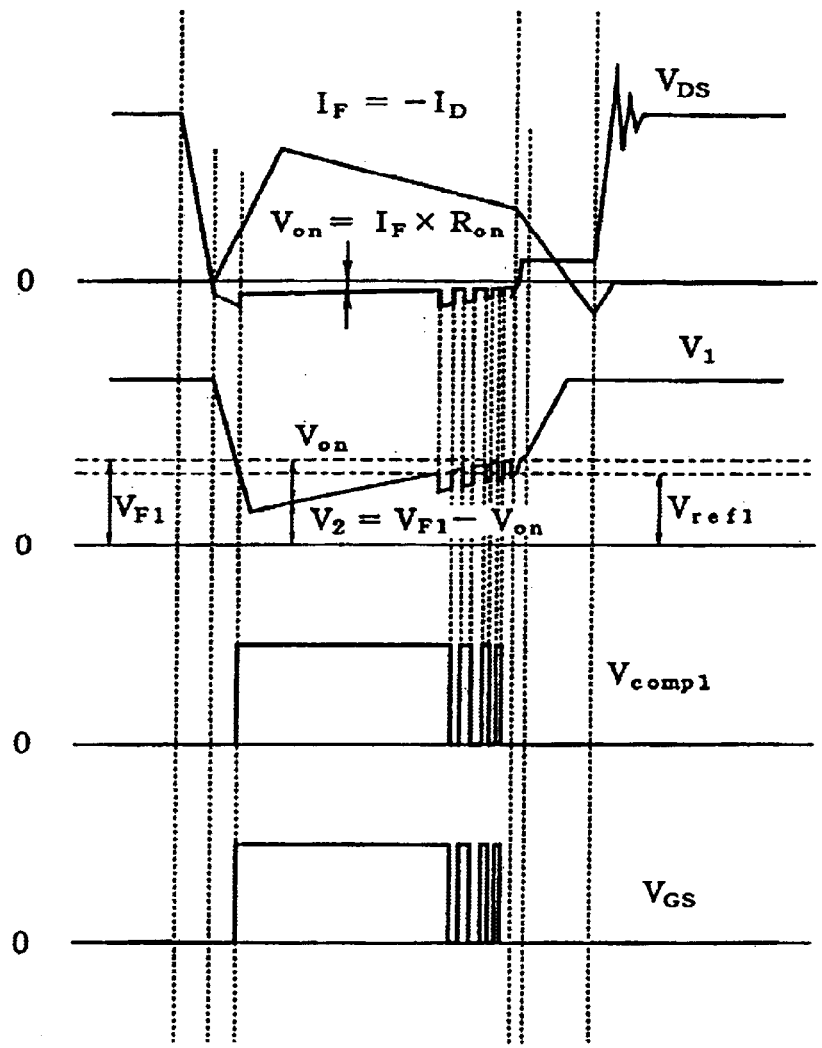
FIG. 12 is a a timing chart for illustrating an operation of the circuit in FIG. 11.

FIG. 12, shows a timing chart where the forward current $I_F$ gradually decreases as the gate voltage $V_{GS}$ of the MOSFET is applied under such a condition as a light load and the voltage $V_1$ across the resistor 3 is around the first reference voltage $V_{ref1}$.

When the voltage $V_1$ across the resistor 3 becomes greater than the first reference voltage $V_{ref1}$, the output of the first voltage comparing unit 5 becomes the Low level, which makes the gate voltage of the MOSFET become the Low level, causing the drain-source voltage $V_{DS}$ of the MOSFET to become a forward voltage of a body diode that is increased. At this time, the lowering of voltage $V_1$ across the resistor 3 below the first reference voltage $V_{ref1}$ causes the gate voltage of the MOSFET to become the High level again. This causes the drain-source voltage $V_{DS}$ of the MOSFET to become a voltage drop $V_{on}$, determined by a product of an on-resistance $R_{on}$ and the forward current $I_F$, and to be made small.

Repetition of the operations causes the gate of the MOSFET to be turned ON and OFF at a high frequency as shown in FIG. 12, which increases a driving loss to lower device efficiency.

Figure 13:
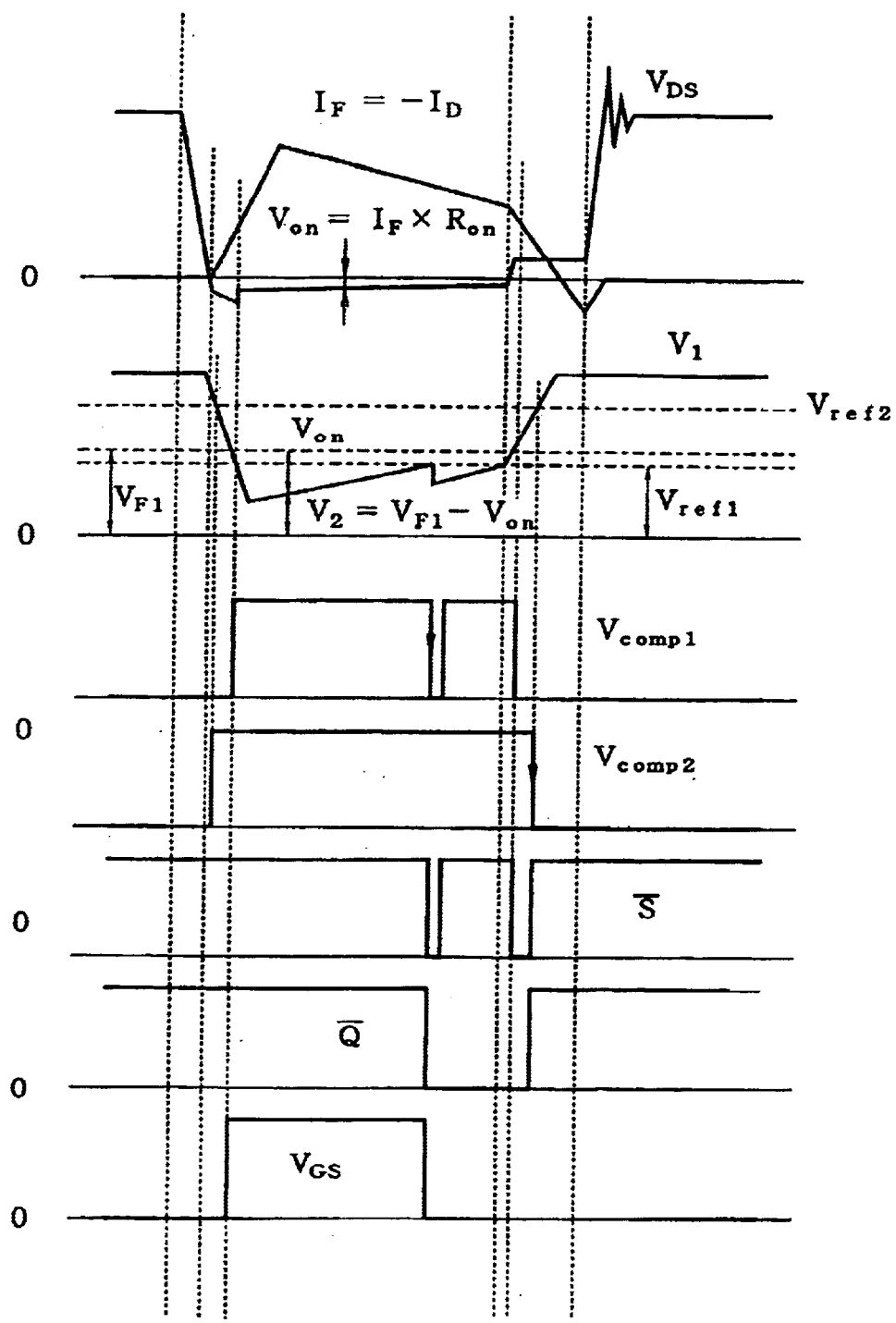
FIG. 13 is a timing chart for illustrating an operation of the circuit in FIG. 11.

In the fourth mode shown in FIG. 11, an arrangement is provided so that, when the voltage $V_1$ across the resistor 3 once becomes above the first reference voltage $V_{ref1}$, no gate voltage is generated until $V_1$ rises up to the second reference voltage $V_{ref2}$. This arrangement prevents the gate of the MOSFET from being turned ON and OFF at a high frequency as described above. In FIG. 13, a timing chart is shown which illustrates an operation with this arrangement.

The timing of the RS flip-flip circuit 15 in FIG. 11 is set at a falling edge of the output $V_{comp1}$ of the first voltage comparing unit 5 and is reset at a falling edge of the output $V_{comp2}$ of the second voltage comparing unit 12.

To prevent the RS flip-flip circuit 15 from being set in a period in which the voltage $V_1$ across the resistor 3 is below the first reference voltage $V_{ref1}$, the output $V_{comp2}$ of the second voltage comparing unit 12, delayed by the delay circuit 13, and the output $V_{comp1}$ of the first voltage comparing unit 5, are inputted to the OR circuit 14, as shown in FIG. 13. Then, the output of the OR circuit 14 is taken as a set signal of the RS flip-flip circuit 15.

An output signal of the RS flip-flip circuit 15 and the output $V_{comp1}$ of the first voltage comparing unit 5 are inputted to the AND circuit 16 to make an output signal which is used as a gate driving signal. In the case where the voltage $V_1$ across the resistor 3 becomes higher than the first reference voltage $V_{ref1}$, the gate signal is held in a state without being generated until the above-described voltage $V_1$ becomes higher than the second reference voltage $V_{ref2}$. Therefore, it is possible to prevent the gate signal from being turned ON and OFF at a high frequency, and thereby increase gate driving power. Thus when a difference between the voltage across the above-described resistor and the first reference voltage becomes equal to or less than a certain value, no gate voltage for the MOSFET is generated.

In the circuit in FIG. 11, the first reference voltage $V_{ref1}$ is taken as being a constant voltage. The first reference voltage $V_{ref1}$, however, can be temperature dependent by making use of the forward voltage drop in the diode 8 as in FIG. 4 and FIG. 7.

Figure 14:
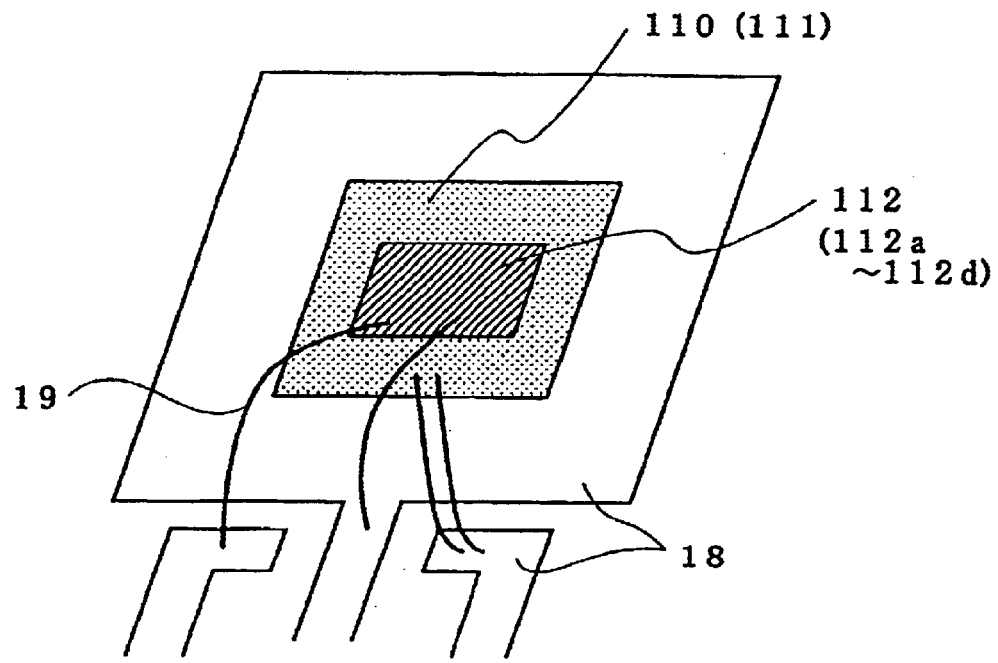
FIG. 14 is a structural view showing a fifth mode for carrying out the invention.

In FIG. 14, there is shown a fifth mode for carrying out the invention. FIG. 14 is a view in which the control circuit 112 (112a to 112d) of the invention is made up into an IC chip to be mounted on a chip of the MOSFET 110 (111). Reference numeral 18 denotes a printed wiring pattern and 19 denotes a wire.

The gate of the MOSFET is connected to an output terminal of the gate driving unit 6 in the control circuit 112 (112*a* to 112*d*), and terminals are provided for connecting the source of the MOSFET to the ground of the control circuit 112 (112*a* to 112*d*), for connecting the cathode of the diode 1 to the drain of the MOSFET, and for taking out a power supply input for the control circuit 112 (112*a* to 112*d*). This can provide a three-terminal composite device using a standard package such as TO220 or TO3P which has long been used, thereby enabling the device to be made compact by reduction in number of components.

Figure 15:
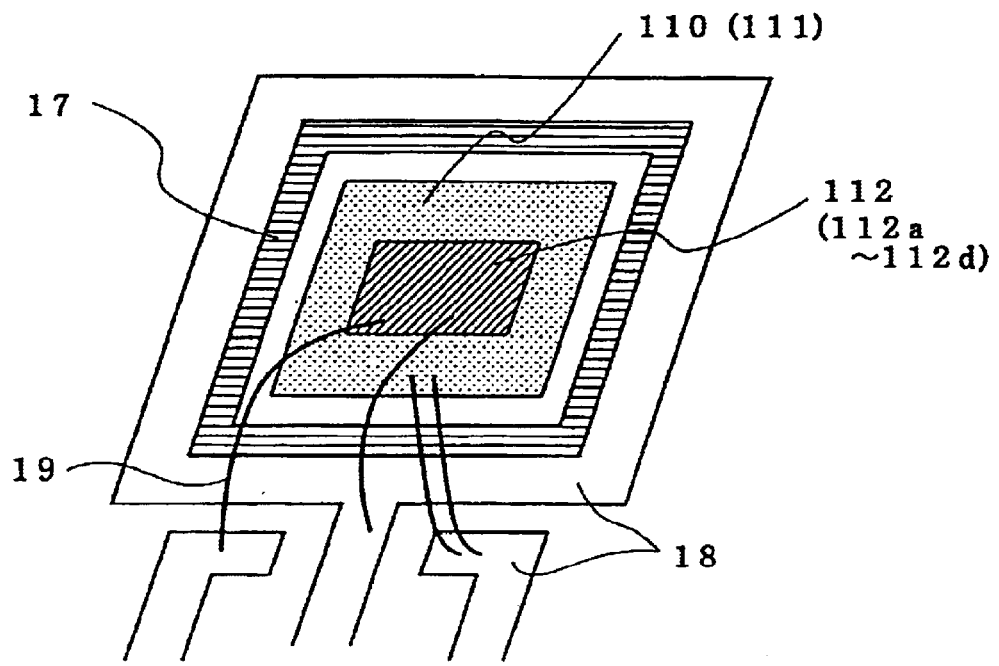
FIG. 15 is a structural view showing a sixth mode for carrying out the invention.
Figure 16:
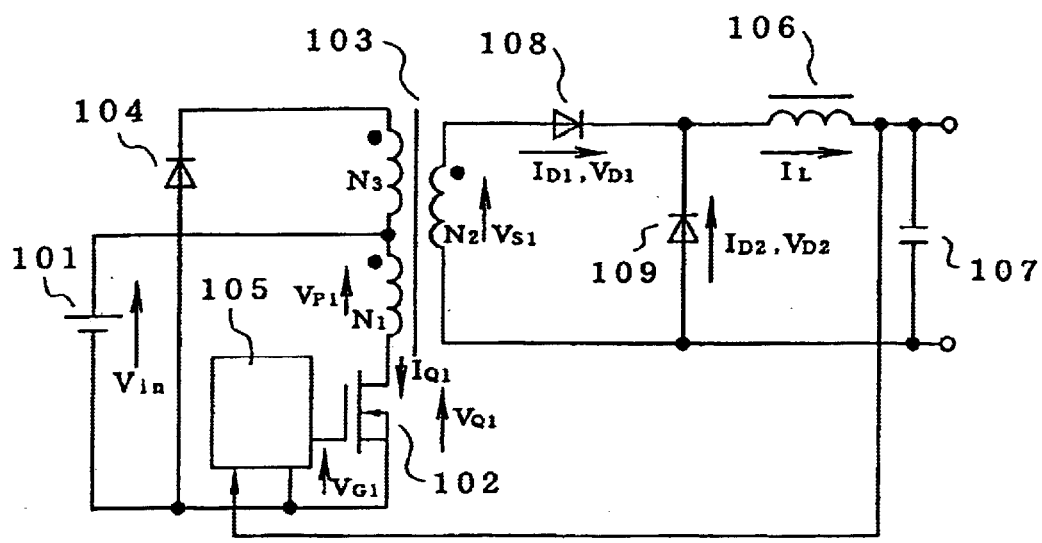
FIG. 16 is a circuit diagram showing a first prior art.
Figure 17:
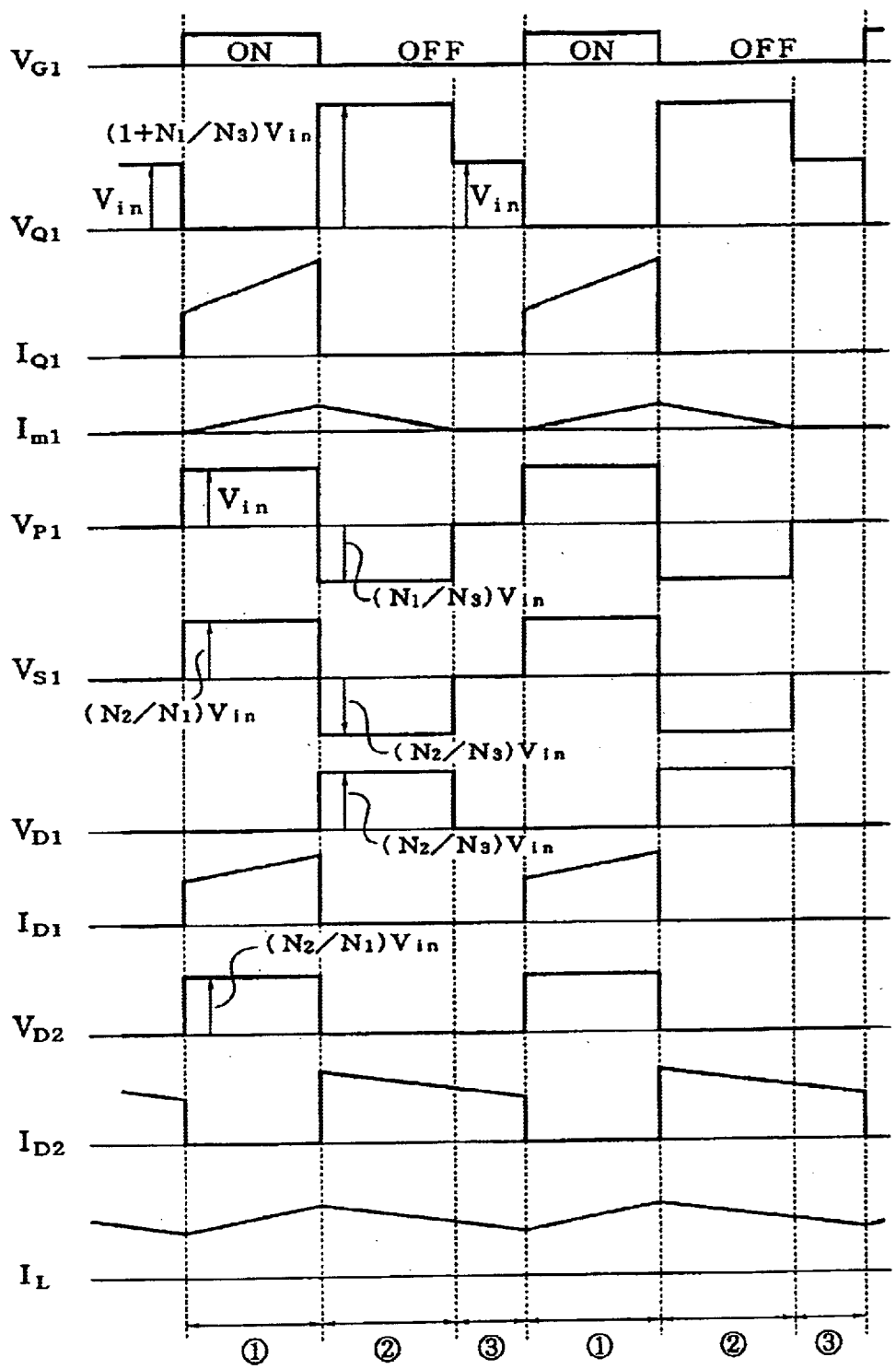
FIG. 17 is a timing chart for illustrating an operation of the circuit in FIG. 16.

FIG. 15 depicts a sixth mode for carrying out the invention. The mode is one in which a magnetic material 17 having a saturable characteristic is arranged around a chip of the MOSFET 110 (111). An operation of the mode is the same as that of the third mode shown in FIG. 8 and the explanation thereof will be omitted. By incorporating the magnetic material 17 having a saturable characteristic in a semiconductor package in this way, it becomes possible to reduce the number of components.

As described above, according to the invention, in almost all of a period in which an negative current flows in a MOSFET for synchronous rectification, a voltage can be applied to a gate. Thus, a rectification loss can be suppressed to be small to increase device efficiency. Lower losses lead to a lower cooling capacity requirement, allowing the size of the cooling device to be decreased, and enabling the entire device to be made compact and lightweight.

What is claimed:

1. A control circuit of a MOSFET for synchronous rectification that applies a gate voltage between a gate and a source of a MOSFET during a period in which a current flows from the source of the MOSFET toward a drain thereof, the control circuit comprising:

a first current supplying unit;

a first diode with an anode connected to an output side of the current supplying unit and a cathode connected to the drain of the MOSFET;

a resistor connected between the above-described anode and the source of the MOSFET;

a voltage comparing unit that compares a voltage across the resistor to a first reference voltage; and a gate driving unit that amplifies an output signal of the voltage comparing unit and applies a gate voltage between the gate and the source of the MOSFET.

2. The control circuit of a MOSFET for synchronous rectification according to claim 1 wherein the first reference voltage for the voltage comparing unit is supplied from a reference current source with a constant voltage value.

3. The control circuit of a MOSFET for synchronous rectification according to claim 1 wherein the first reference voltage for the voltage comparing unit is taken as a forward voltage drop generated when a current is made to flow from a second current supplying unit to a second diode.

4. The control circuit of a MOSFET for synchronous rectification according to claim 3 wherein the first diode and the second diode have forward temperature characteristics approximately identical with each other.

5. The control circuit of a MOSFET for synchronous rectification according to claim 1 wherein a gate voltage for the MOSFET is not generated when a difference between the voltage across the above-described resistor and the first reference voltage becomes equal to or less than a certain value.

6. The control circuit of a MOSFET for synchronous rectification according to claim 1 wherein a saturable reactor is connected between the drain of the MOSFET and the cathode of the first diode.

7. The control circuit of a MOSFET for synchronous rectification according to claim 1 wherein the control circuit is an IC chip mounted on a chip of the MOSFET.

8. The control circuit of a MOSFET for synchronous rectification according to claim 1 wherein a magnetic material having a saturable characteristic is arranged around the control circuit made up into an IC chip mounted on the chip of the MOSFET.

9. The control circuit of a MOSFET for synchronous rectification according to claim 1 wherein a magnetic material having a saturable characteristic is arranged around the MOSFET.

* * * * *